(12) United States Patent
Liu et al.

(10) Patent No.: US 10,147,636 B2
(45) Date of Patent: Dec. 4, 2018

(54) METHODS FOR FABRICATING TRENCH ISOLATION STRUCTURE

(71) Applicant: Vanguard International Semiconductor Corporation, Hsinchu (TW)

(72) Inventors: Shin-Hao Liu, Taoyuan (TW); Chih-Cherng Liao, Jhudong Township (TW); Ching-Yi Hsu, Hsinchu (TW); Yun-Chou Wei, Taipei (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 15/193,632

(22) Filed: Jun. 27, 2016

(65) Prior Publication Data
US 2017/0372944 A1    Dec. 28, 2017

(51) Int. Cl.
*H01L 21/762* (2006.01)
*H01L 21/66* (2006.01)

(52) U.S. Cl.
CPC ........ *H01L 21/76232* (2013.01); *H01L 22/12* (2013.01)

(58) Field of Classification Search
CPC ......... H01L 21/76232; H01L 21/02065; H01L 21/3086; H01L 21/76224–21/76237;
(Continued)

(56) References Cited

U.S. PATENT DOCUMENTS 5,665,202 A * 9/1997 Subramanian .... H01L 21/31053
216/11
5,721,172 A * 2/1998 Jang ................. H01L 21/76224
216/38

(Continued)

FOREIGN PATENT DOCUMENTS

KR   10-1998-082731 A   12/1998
KR   10-2002-002568 A    4/2002

(Continued)

OTHER PUBLICATIONS

Korean Office Action and English translation, dated Sep. 20, 2017, for Korean Application No. 10-2016-0105651.

*Primary Examiner* — Joshua King
(74) *Attorney, Agent, or Firm* — Birch, Stewart, Kolasch & Birch, LLP (57) ABSTRACT

A method for fabricating a trench isolation structure is provided. The method includes providing a substrate and forming a patterned mask layer on the substrate. A first etching step is performed on the substrate by using the patterned mask layer to form a trench in the substrate. A dielectric material is formed in the trench and on the patterned mask layer, wherein the dielectric material on the patterned mask layer has a first height. An etch back step is performed to decrease the dielectric material on the patterned mask layer to a second height. A planarization process is performed to remove the dielectric material on the patterned mask layer, where a polishing pad is used, and a first pressure and a second pressure are respectively applied on a central portion and a peripheral portion of the polishing pad, wherein the second pressure is greater than the first pressure.

17 Claims, 8 Drawing Sheets

(58) Field of Classification Search
CPC .................. H01L 21/31055–21/31056; H01L 21/311–21/31122; H01L 21/3212–21/32125
See application file for complete search history.

(56) References Cited

U.S. PATENT DOCUMENTS

| | | | | |
|---|---|---|---|---|
| 5,783,488 | A * | 7/1998 | Bothra | H01L 21/31053 257/E21.244 |
| 5,923,993 | A * | 7/1999 | Sahota | H01L 21/76229 148/DIG. 50 |
| 6,022,807 | A * | 2/2000 | Lindsey, Jr. | B24B 37/04 216/38 |
| 6,033,970 | A * | 3/2000 | Park | H01L 21/76229 148/DIG. 50 |
| 6,048,775 | A * | 4/2000 | Yao | H01L 21/76224 257/E21.546 |
| 6,169,012 | B1 * | 1/2001 | Chen | H01L 21/76229 257/E21.548 |
| 6,184,141 | B1 * | 2/2001 | Avanzino | H01L 21/3212 257/E21.304 |
| 6,242,322 | B1 * | 6/2001 | Chen | H01L 21/76229 257/E21.548 |
| 6,261,957 | B1 * | 7/2001 | Jang | H01L 21/76229 216/38 |
| 6,342,429 | B1 * | 1/2002 | Puchner | H01L 21/76237 257/E21.551 |
| 6,489,242 | B1 * | 12/2002 | Nagahara | H01L 21/31051 257/E21.243 |
| 6,541,382 | B1 * | 4/2003 | Cheng | H01L 21/76232 257/E21.244 |
| 6,558,232 | B1 * | 5/2003 | Kajiwara | B24B 37/30 451/288 |
| 6,897,121 | B2 * | 5/2005 | Lee | H01L 21/31053 257/E21.244 |
| 7,199,018 | B2 * | 4/2007 | Hung | H01L 21/31055 257/E21.245 |
| 7,759,214 | B2 * | 7/2010 | Yoon | H01L 21/76232 438/424 |
| 2003/0216104 | A1 * | 11/2003 | Korovin | B24B 37/042 451/5 |
| 2004/0147205 | A1 * | 7/2004 | Golzarian | B24B 53/12 451/5 |
| 2005/0000940 | A1 * | 1/2005 | Iwamoto | H01L 21/31111 216/83 |
| 2005/0003668 | A1 * | 1/2005 | Hung | H01L 21/31055 438/691 |
| 2005/0142800 | A1 * | 6/2005 | Choi | H01L 21/76235 438/424 |
| 2005/0159007 | A1 * | 7/2005 | Chen | H01L 21/02164 438/700 |
| 2005/0255668 | A1 * | 11/2005 | Tseng | H01L 21/76232 438/424 |
| 2006/0043071 | A1 * | 3/2006 | Lee | H01L 21/12 216/88 |
| 2007/0224918 | A1 * | 9/2007 | Terada | B24B 29/005 451/6 |
| 2012/0292748 | A1 * | 11/2012 | Sadaka | H01L 21/31053 257/635 |
| 2014/0015107 | A1 * | 1/2014 | Chen | B24B 37/015 257/618 |
| 2015/0279686 | A1 * | 10/2015 | Kuo | H01L 22/20 438/5 |
| 2015/0311093 | A1 * | 10/2015 | Li | H01L 21/02065 438/693 |

FOREIGN PATENT DOCUMENTS

| | | |
|---|---|---|
| KR | 10-2004-0036757 A | 5/2004 |
| TW | 200409235 A | 6/2004 |
| TW | 200707630 A | 2/2007 |
| TW | 201225212 A1 | 6/2012 |

* cited by examiner

METHODS FOR FABRICATING TRENCH ISOLATION STRUCTURE

BACKGROUND

Field of the Invention

The present invention relates to semiconductor processes, and in particular to methods for fabricating a trench isolation structure having better height uniformity.

Description of the Related Art

An isolation structure of a semiconductor device is generally provided to electrically isolate semiconductor elements such as transistors, resistors, and capacitors in an active region from other semiconductor elements in a neighboring active region on a same semiconductor substrate.

At present, the isolation structure that is often used includes a trench isolation structure, wherein neighboring active regions are electrically isolated from one another by a trench formed vertically in the semiconductor substrate filled with an isolation dielectric. The isolation dielectric is typically made of silicon oxide ($SiO_2$). The trench is formed in the substrate according to the desired pattern of an isolation region, and then the isolation dielectric is formed to fill the trench to form a trench isolation structure. However, the height (or thickness) uniformity of the trench isolation structure is usually not good.

BRIEF SUMMARY

In some embodiments of the disclosure, a method for fabricating a trench isolation structure is provided. The method includes providing a substrate, forming a patterned mask layer on the substrate, performing a first etching step to the substrate by using the patterned mask layer to form a trench in the substrate, and forming a dielectric material in the trench and on the patterned mask layer, wherein the dielectric material on the patterned mask layer has a first height. The method also includes performing an etch back step to decrease the dielectric material on the patterned mask layer from the first height to a second height, and performing a planarization process to remove the dielectric material on the patterned mask layer, wherein a polishing pad is used during the planarization process, a first pressure is applied on a central portion of the polishing pad, a second pressure is applied on a peripheral portion of the polishing pad, and the second pressure is greater the first pressure.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is about methods for fabricating a trench isolation structure according to embodiments of the disclosure. However, it should be appreciated that the embodiments of the disclosure provide lots of suitable concepts of the invention and can be performed in a wide variety of specific backgrounds. The specific embodiments of the disclosure are used to explain the fabrication by specific methods and use of the invention and should not be taken in a limiting sense. The scope of the invention is best determined by reference to the appended claims. Moreover, the same or similar elements in the drawings and the description are labeled with the same reference numbers.

Figure 1A:
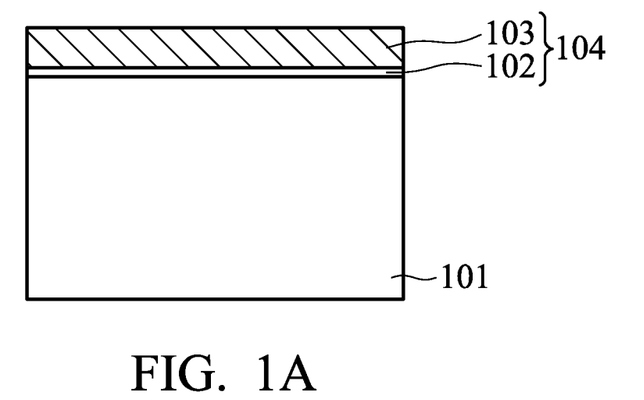
FIGS. 1A-1K shows cross sections of various stages of a method of fabricating a trench isolation structure according to some embodiments of the disclosure.

FIGS. 1A-1K show cross sections of various stages of a method of fabricating a trench isolation structure 100 according to some embodiments of the disclosure. In FIG. 1A, a substrate 101 is provided, and a mask layer 104 is formed on the substrate 101 by a deposition process (for example, a physical vapor deposition process, a chemical vapor deposition process or another suitable process). In some embodiments, the substrate 101 may be a single crystal silicon substrate, an epitaxial silicon substrate, a silicon germanium substrate, a compound semiconductor substrate or another suitable substrate. In some embodiments, the mask layer 104 includes a pad oxide layer 102 and a silicon nitride layer 103, and the silicon nitride layer 103 is located above the pad oxide layer 102. In some embodiments, the silicon nitride layer 103 may be replaced with silicon oxynitride or another similar material.

Figure 1B:
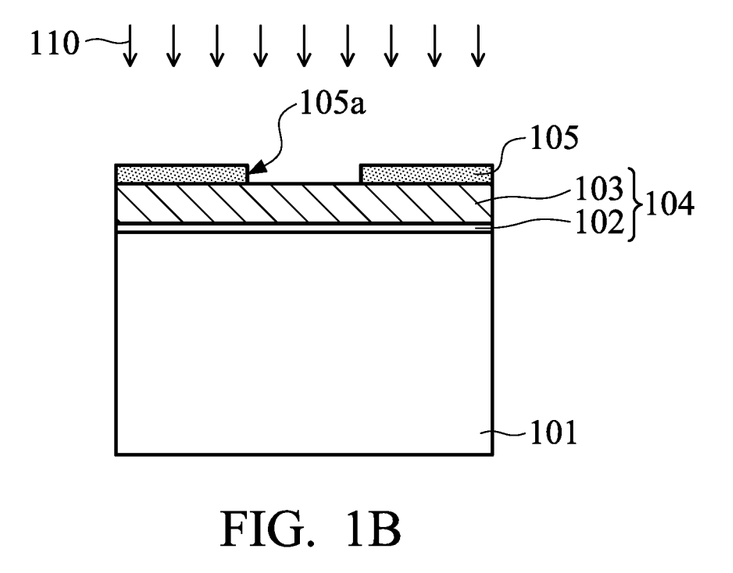
Figure 1C:
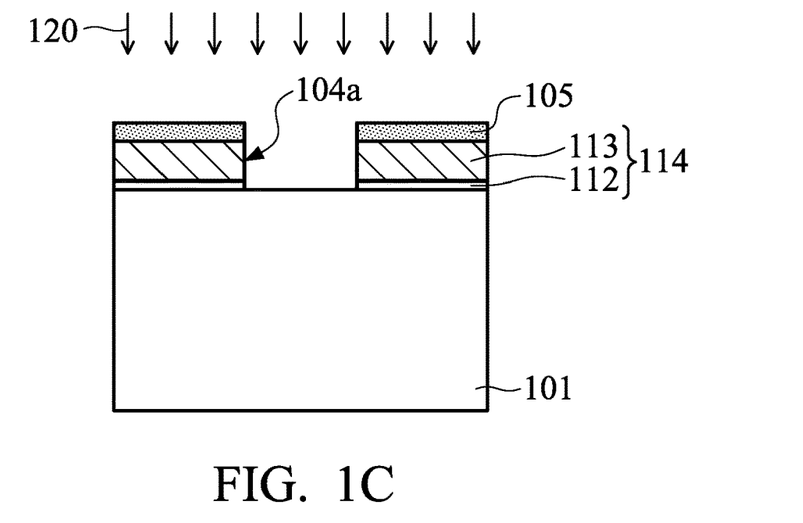

Refer to FIGS. 1B-1C, a patterned photoresist 105 is formed on the mask layer 104 through a lithography patterning process including photoresist coating (for example, spin-coating), soft baking, mask aligning, exposing, post-exposure baking, photoresist developing, washing and drying (for example, hard baking), another suitable patterning process or a combination thereof. As shown in FIG. 1B, the patterned photoresist 105 has an opening 105a to expose the mask layer 104. An etching step 110 (for example, a dry-etching process, wet-etching process, plasma-etching process, reactive ion etching process or another suitable process) is performed on the mask layer 104 by using the patterned photoresist 105 to form a patterned mask layer 114 (including a pad oxide layer 112 and a silicon nitride layer 113 after etching) on the substrate 101. As shown in FIG. 1C, the patterned mask layer 114 has an opening 104a to expose the substrate 101.

Figure 1D:
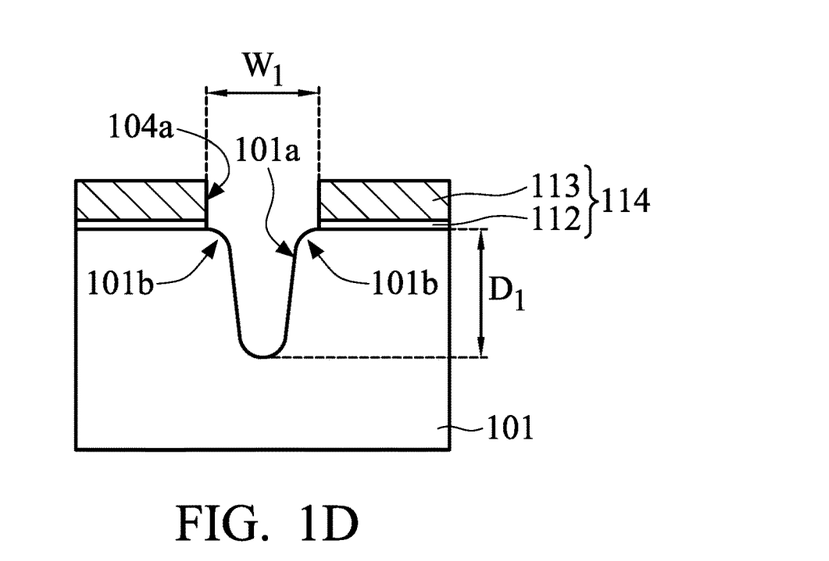

Refer to FIGS. 1C-1D, an etching step 120 is performed on the substrate 101 by using the patterned mask layer 114 as an etching mask to form a trench 101a in the substrate 101 below the opening 104a. The trench 101a has a top width $W_1$ and a depth $D_1$. After the trench 101a is formed, the patterned photoresist 105 is removed. In some embodiments, the depth $D_1$ is about 0.8 μm, but it is not limited thereto. The depth of the trench 101a may be determined according to design requirements. In the embodiment, the etching step 120 further includes a top corner rounding (TCR) process in addition to an etching process such as a dry-etching process, wet-etching process, plasma-etching process, reactive ion etching process or another suitable process, such that a rounding corner 101b is formed between a sidewall of the trench 101a and a top surface of the substrate 101.

As shown in FIG. 1D, the rounding corner 101b is formed from a top corner of the trench 101a by the top corner rounding process. The rounding corner 101b can avoid the top corner of the trench 101a being too sharp, and a leakage current produced during the operation of elements which are subsequently formed around the trench 101a is thereby avoided. Therefore, the top corner rounding process of the trench 101a can enhance the reliability of the elements. Moreover, since the rounding corner 101b protrudes outward, the entire average width of the trench 101a is smaller than the top width $W_1$. Therefore, an aspect ratio of the trench 101a can be enhanced. In some embodiments, the trench 101a has an aspect ratio of between 0.375 and 0.5.

Figure 1E:
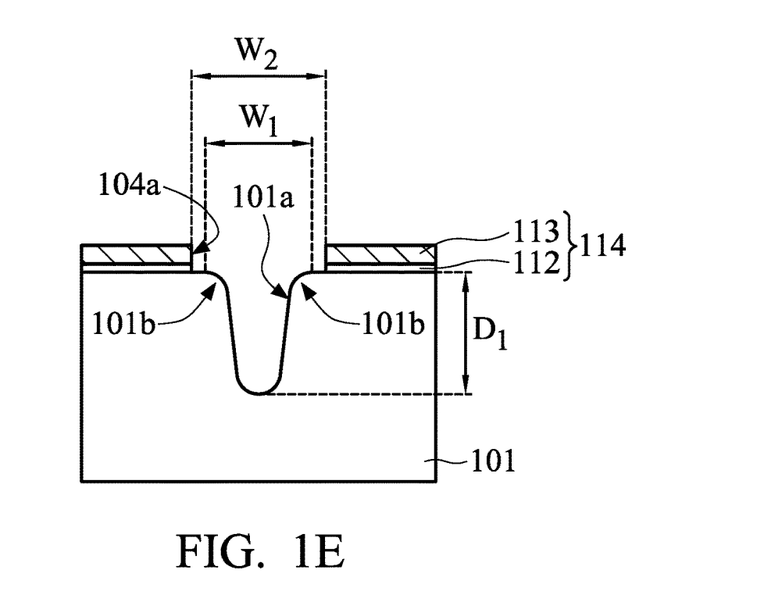

Refer to FIGS. 1D-1E, a pullback process is performed on the patterned mask layer 114 to enlarge the width of the opening 104a of the patterned mask layer 114. As shown in FIG. 1E, after the pullback process, a width $W_2$ of the opening 104a of the patterned mask layer 114 is bigger than the top width $W_1$ of the trench 101a. In some embodiments, the pullback process is an isotropic etching process (for example, a wet-etching process). Therefore, while the width of the opening 104a is enlarged, the thickness of the patterned mask layer 114 is decreased. Through the pullback process, the opening 104a is enlarged, which is an advantage for subsequently filling dielectric material in the trench 101a. Therefore, the difficulty of subsequently filling the trench 101a is thereby reduced.

Figure 1F:
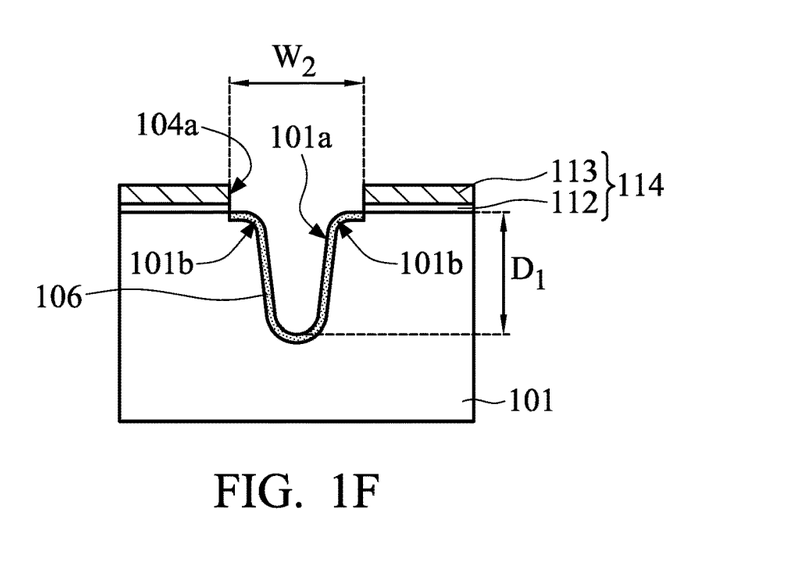

In FIG. 1F, an oxide liner layer 106 is formed in the substrate 101 at the sidewalls and bottom of the trench 101a by an oxidation process (for example, thermal oxidation process, radical oxidation process or another suitable process), and an annealing process is performed on the oxide liner layer 106 to increase the density of the oxide liner layer 106. In some embodiments, the annealing process may be a rapid thermal annealing (RTA) process.

Figure 1G:
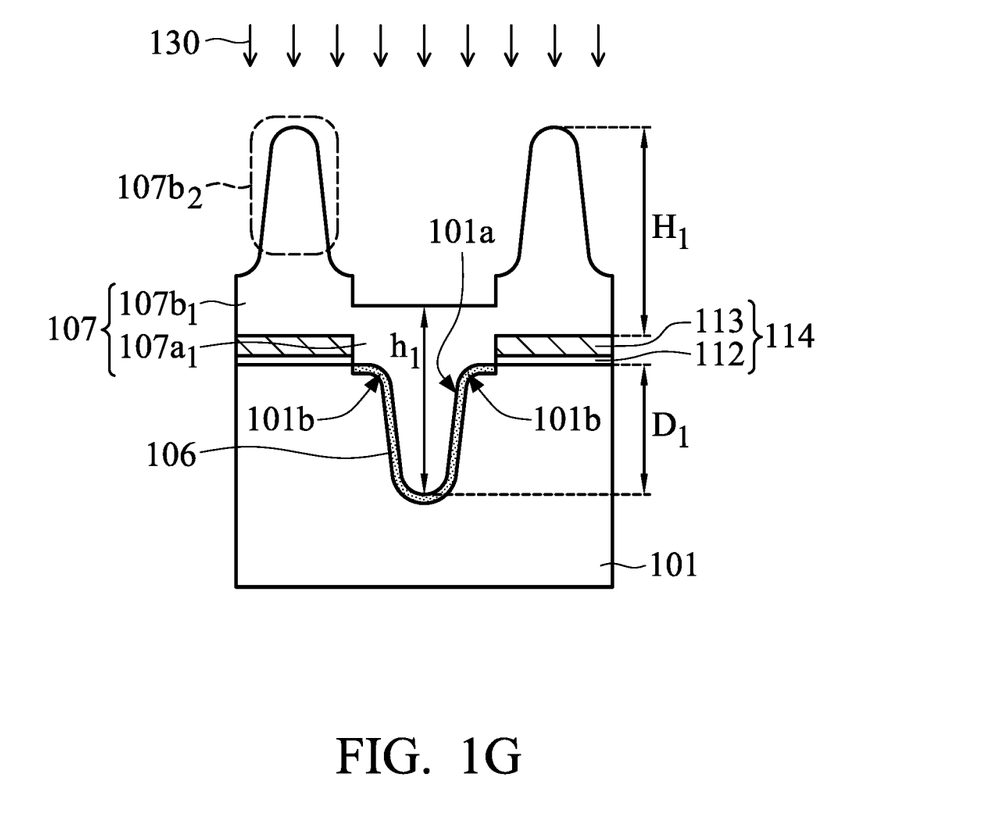

In FIG. 1G, dielectric material 107 including dielectric material $107a_1$ in the trench 101a and dielectric material $107b_1$ on the patterned mask layer 114 is formed in the trench 101a and on the patterned mask layer 114 by a deposition process (for example, a physical vapor deposition process, a chemical vapor deposition process or another suitable process). The dielectric material $107a_1$ has a height $H_1$, and the dielectric material $107b_1$ has a height $h_1$. In some embodiments, the deposition process may be a high-density plasma chemical vapor deposition (HDPCVD) process. In some embodiments, the height $H_1$ of the dielectric material $107a_1$ is equal to the height $h_1$ of the dielectric material $107b_1$. In some embodiments, the height $H_1$ is about 1.4 μm. In some embodiments, the material of the dielectric material 107 may include oxide, nitride, carbide, another suitable material or a combination thereof.

Figure 1H:
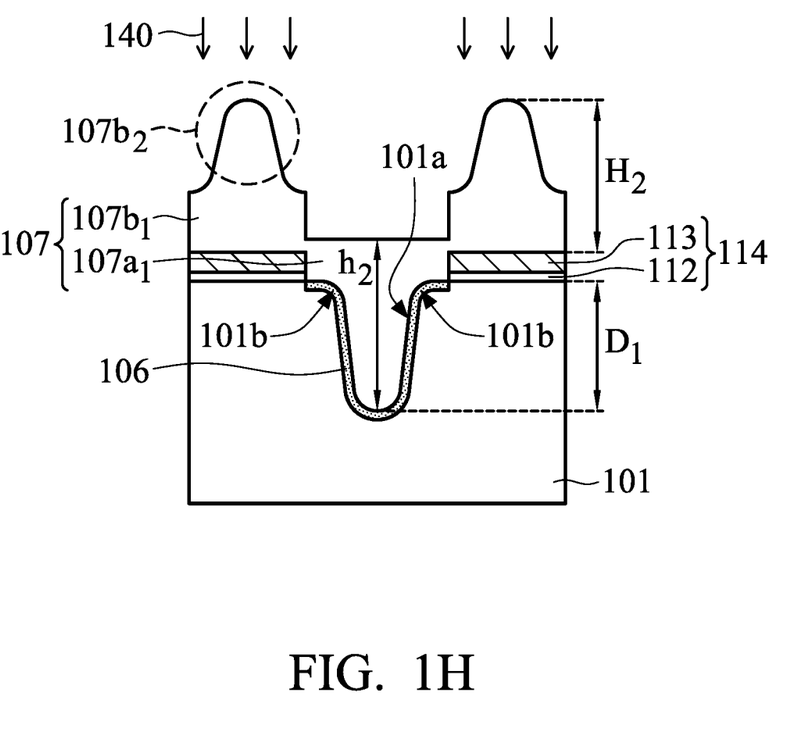

Refer to FIGS. 1G-1H, in which an etch back step 130 is performed to decrease the dielectric material $107a_1$ in the trench 101a from the height $h_1$ to a height $h_2$ and to decrease the dielectric material $107b_1$ on the patterned mask layer 114 from the height $H_1$ to a height $H_2$, as shown in FIG. 1H. In some embodiments, the etch back step 130 includes a sputter etch back process, which uses Ar to perform an ion bombardment and is an anisotropic etching process. In some embodiments, the difference between the height $H_1$ and the height $H_2$ is about 0.2 μm-0.3 μm.

As shown in FIGS. 1G-1H, through the etch back step 130 including the sputter etch back process, the height of a protruding portion $107b_2$ of the dielectric material $107b_1$ on the patterned mask layer 114 is effectively decreased, which is an advantage to a subsequent step of removing the dielectric material $107b_1$.

Figure 1I:
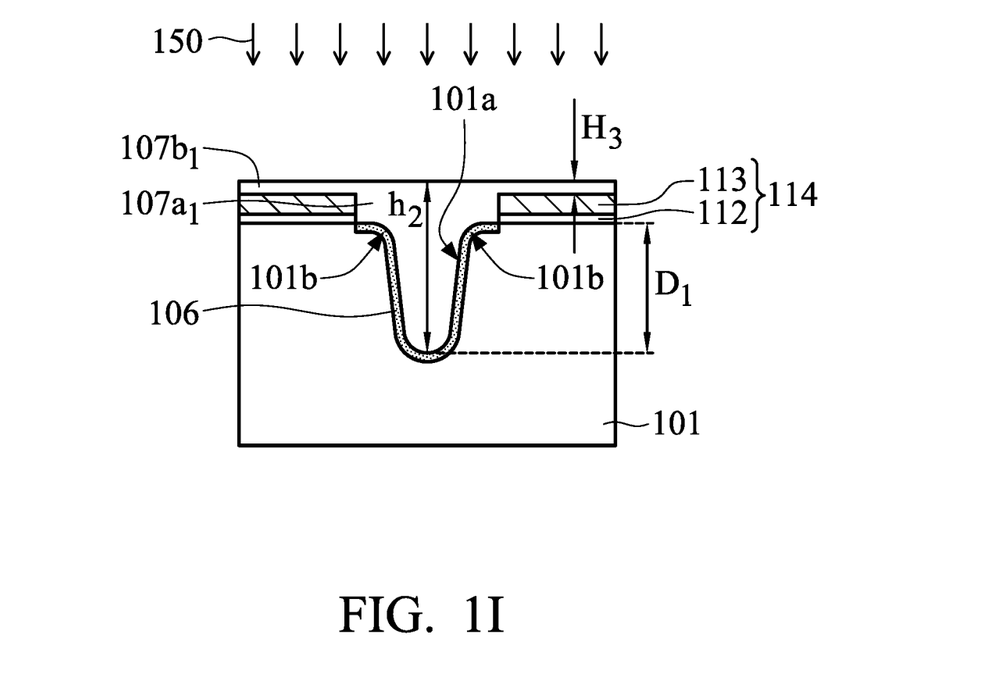

Refer to FIGS. 1H-1I, after the etch back step 130, an etching step 140 is performed on the dielectric material $107b_1$ on the patterned mask layer 114. The etching step 140 is an selective etching step to the dielectric material $107b_1$, and the etching step 140 can be a dry-etching process, which uses etching gas such as $C_4F_8$ and Ar to perform etching, and the dry-etching process has an etch selectivity ratio of the patterned mask layer 114 to the dielectric material $107b_1$ that is 1:20-1:25. After the etching step 140, the dielectric material $107b_1$ is decreased from the height $H_2$ to a height $H_3$, as shown in FIG. 1I, and the height $H_3$ is 2%-3.5% of the height $H_2$. In some embodiments, after the etching step 140, the top surface of the dielectric material $107b_1$ is level with the top surface of the dielectric material $107a_1$.

Since the etching step 140 is applied with a dry-etching process which has a higher etch selectivity ratio to the dielectric material compared to a traditional dry-etching process (the traditional dry-etching process has an etch selectivity ratio of the patterned mask layer to the dielectric material that is 1:7-1:8), i.e. the dry-etching process of the disclosure has an etching rate to the dielectric material $107b_1$ that is much higher than the etching rate to the patterned mask layer 114. Therefore, the etching step 140 does not damage to the patterned mask layer 114, and surface non-uniformity of the silicon nitride layer 113 of the patterned mask layer 114 is thereby avoided.

Refer to FIGS. 1G-1I, through the combination of the etch back step 130 and the subsequent etching step 140, the height of the dielectric material $107b_1$ on the patterned mask layer 114 is effectively decreased, such that the top surface of the dielectric material $107b_1$ is closer to the top surface of the dielectric material $107a_1$ in the trench 101a, without causing damage to the patterned mask layer 114.

Figure 1J:
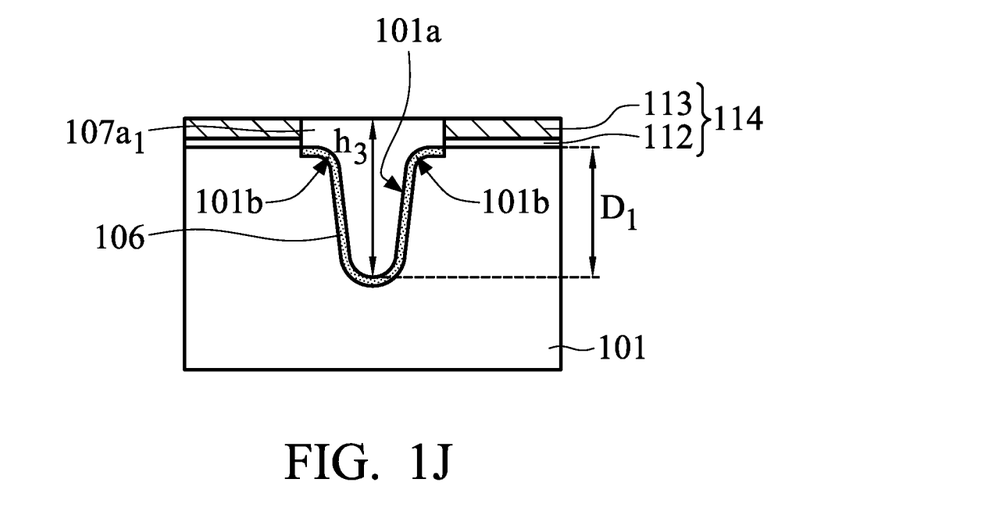
Figure 2:
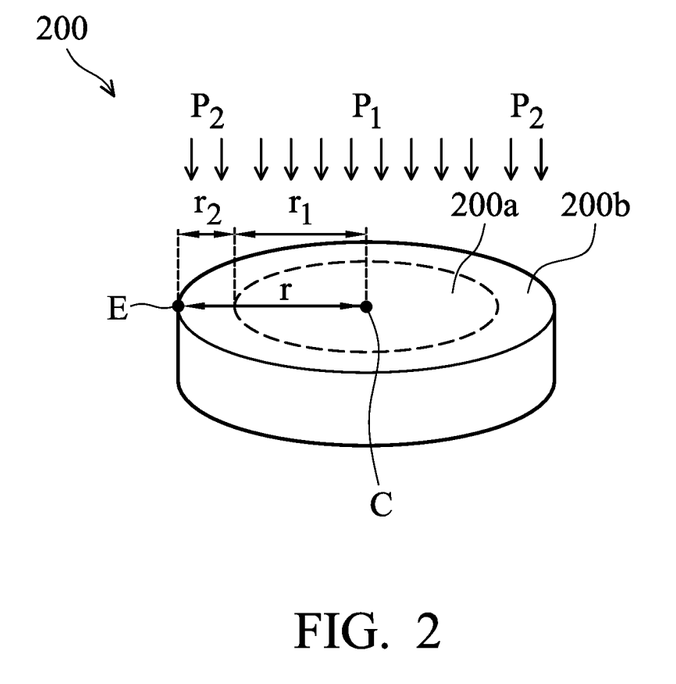
FIG. 2 shows a stereoscopic view of a polishing pad used during a planarization process according to some embodiments of the disclosure.

Refer to FIGS. 1I-1J, a planarization process 150 is performed to remove the dielectric material $107b_1$ on the patterned mask layer 114 and to decrease the dielectric material $107a_1$ in the trench 101a from the height $h_2$ to a height $h_3$. As shown in FIG. 1J, the top surface of the patterned mask layer 114 is level with the top surface of the dielectric material $107a_1$. In the embodiment, the planarization process 150 may be chemical mechanical polishing (CMP) process. As shown in FIG. 2, it shows a stereoscopic view of a polishing pad 200 used during the planarization process 150 according to some embodiments of the disclosure. The planarization process 150 uses the polishing pad 200, a first pressure $P_1$ is applied on a central portion 200a of the polishing pad 200, a second pressure $P_2$ is applied on a peripheral portion 200b of the polishing pad 200, and the second pressure $P_2$ is greater than the first pressure $P_1$. In some embodiments, along a direction from an edge E to a central point C of the polishing pad 200, the ratio of the width $r_2$ of the peripheral portion 200b of the polishing pad 200 to the width $r_1$ of the central portion 200a of the polishing pad 200 is about 1:1-7:13, i.e. the width $r_2$ is 35%-50% of the radius r of the polishing pad 200. In some embodiments, the difference between the second pressure $P_2$ and the first pressure $P_1$ is 30 psi-40 psi.

Since the second pressure $P_2$ applied on the peripheral portion 200b of the polishing pad 200 is greater than the first pressure $P_1$ applied on the central portion 200a of the polishing pad 200, an edge impress control to the peripheral portion of the polishing pad 200 is enhanced, and the problem of a poor polishing rate to the peripheral portion of the polishing pad in a traditional chemical mechanical polishing process is thereby overcome. Therefore, the top surface of the patterned mask layer 114 is level with the top surface of the dielectric layer $107a_1$ in FIG. 1J and better surface height (or thickness) uniformity is achieved.

Before the planarization process 150 being performed, the etch back step 130 and the etching step 140 have been performed to remove the dielectric material $107b_1$ on the patterned mask layer 114 and a portion of the dielectric material $107a_1$ higher than the top surface of the patterned mask layer 114. Therefore, the etch back step 130 and the etching step 140 can reduce the process load of the planarization process 150 of removing the aforementioned dielectric material 107a$_1$ and 107b$_1$.

After the planarization process 150 has been performed, a multi-point measurement of the height (or thickness) is performed on the dielectric material 107a$_1$ in the trench 101a and the silicon nitride layer 113 included in the patterned mask layer 114. The measurement of the height of the dielectric material 107a$_1$ is referred to as the vertical height h$_3$ of the dielectric material 107a$_1$ from the surface of the dielectric material 107a$_1$ to the bottom of the trench 101a. The vertical height h$_3$ is also called the trench step height. In the embodiment, through the combination of the etch back step 130, the etching step 140, and the planarization process 150 including the edge impress control to the peripheral portion of the polishing pad, experimental data shows that the amount of measurement samples that exceed the average height of the dielectric material 107a$_1$ by three standard deviations is about 5% of the entire amount of measurement samples. The amount of measurement samples which exceed the average height of the silicon nitride layer 113 by three standard deviations is about 20.1% of the entire amount of measurement samples. In a comparative example, methods for fabricating an isolation structure do not include the etch back step 130 in the embodiment, and the methods use traditional planarization process (i.e. pressures applied to the center of the polishing pad and the edge of the polishing pad are identical). In the comparative example, experimental data shows that the amount of measurement samples which exceed the average height of the dielectric material 107a$_1$ by three standard deviations is about 10.1% of the entire amount of measurement samples, and the amount of measurement samples which exceed the average height of the silicon nitride layer 113 of the patterned mask layer 114 by three standard deviations is about 38.7% of the entire amount of measurement samples.

It can be learned from the embodiment and the comparative example that, through the combination of the etch back step 130, the etching step 140, and the planarization process 150 including the edge impress control to the peripheral portion of the polishing pad, the ratio of the amount of measurement samples which exceed the average height of the dielectric material 107a$_1$ in the trench 101a by three standard deviations to the entire amount of measurement samples can be reduced, and the ratio of the amount of measurement samples which exceed the average height of the silicon nitride layer 113 of the patterned mask layer 114 by three standard deviations to the entire amount of measurement samples can be reduced. Namely, in the embodiment, the height of the dielectric material 107a$_1$ in the trench 101a in any point of measurement range is closer to its average height, and the height of the silicon nitride layer 113 in any point of measurement range is closer to its average height. In other words, the trench step height of the dielectric material 107a$_1$ in the trench 101a and the thickness of the silicon nitride layer 113 included in the patterned mask layer 114 have better uniformity.

Figure 1K:
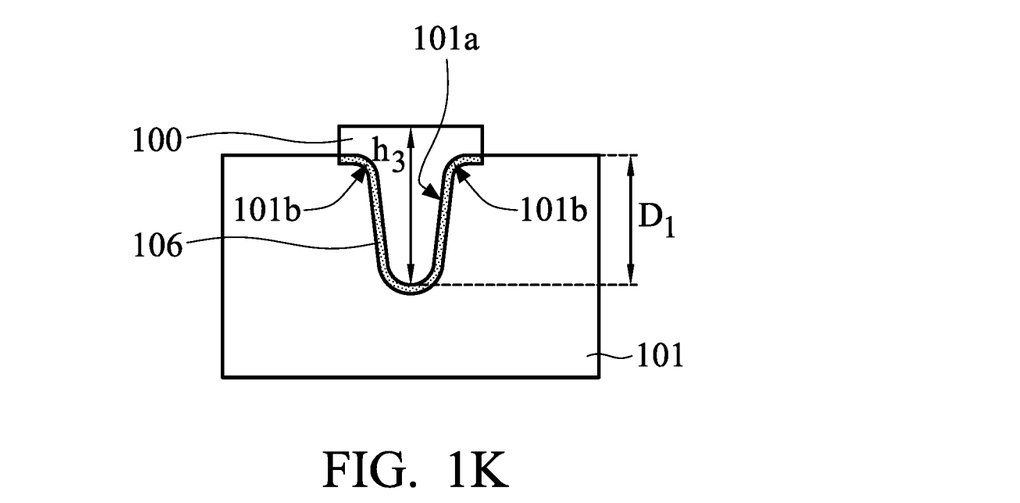

Refer to FIGS. 1J-1K, in which the patterned mask layer 114 is removed to complete the trench isolation structure 100. In some embodiments, a wet-etching process is used to remove the patterned mask layer 114. In some embodiments, a phosphoric acid solution is used to remove the silicon nitride layer 113 and the pad oxide layer 112 of the patterned mask layer 114 one after another in the wet-etching process. In some other embodiments, in the wet-etching process, phosphoric acid solution is used to remove the silicon nitride layer 113 of the patterned mask layer 114 at first, and dilute hydrofluoric acid is used to remove the pad oxide layer 112 of the patterned mask layer 114. In some embodiments, the trench isolation structure 100 is a middle trench isolation (MTI) structure, but it is not limited thereto. The depth of the trench 101a may be determined according to design requirements to form another type of trench isolation structure.

In traditional technology, after a trench isolation structure is formed, a step of conformally forming a polysilicon layer over an active region and the trench isolation structure and a step of removing the polysilicon layer over the trench isolation structure are included. Since the top surface of the traditional trench isolation structure is more uneven, the polysilicon layer would be left on the top surface of the trench isolation structure after the etching process, and the isolation function of the trench isolation structure is thereby damaged.

Since the dielectric material 107a$_1$ of the trench isolation structure 100 fabricated according to some embodiments of the disclosure has better height (or thickness) uniformity, the top surface of the trench isolation structure 100 is more even, and subsequently formed elements (not shown) in the active region on both sides of the trench isolation structure 100 are thereby prevented from being left on the top surface of the trench isolation structure 100 and damaging the isolation function of the trench isolation structure 100. Therefore, the reliability and the yield of the devices are thereby enhanced.

According to some embodiments of the disclosure, the rounding corner is formed from a top corner of the trench by the top corner rounding process, and a leakage current produced during the operation of the devices is thereby avoided. Therefore, the top corner rounding process of the trench can enhance the reliability of the devices. Moreover, since the rounding corner of the trench protrudes outward, an entire average width of the trench is smaller than the top width of the trench. Therefore, an aspect ratio of the trench can be enhanced.

In addition, through the etch back step, the height of the protruding portion of the dielectric material on the patterned mask layer is effectively decreased, which is an advantage to the subsequent step of removing the dielectric material.

Moreover, through the second pressure applied on the peripheral portion of the polishing pad is greater than the first pressure applied on the central portion of the polishing pad, the problem of a poor polishing rate to the peripheral portion of the polishing pad in a traditional chemical mechanical polishing process is solved. Therefore, the top surface of the patterned mask layer is level with the top surface of the dielectric layer and has better surface height (or thickness) uniformity.

Furthermore, through the etch back step and the subsequent etching step, the process load of the planarization process can be reduced, and the trench step height of the dielectric material in the trench and the silicon nitride layer included in the patterned mask layer have better height (or thickness) uniformity.

The method of fabricating the trench isolation structure according to the embodiments of the disclosure can be applied to metal oxide semiconductor field effect transistors (MOSFET) and a driving chip of liquid-crystal displays (LCD).

While the disclosure has been described by way of example and in terms of the embodiments, it is to be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating a trench isolation structure, comprising:
    providing a substrate;
    forming a patterned mask layer on the substrate;
    performing a first etching step to the substrate by using the patterned mask layer to form a trench in the substrate;
    forming a dielectric material in the trench and on the patterned mask layer, wherein the dielectric material on the patterned mask layer has a first height;
    performing an etch back step to decrease the dielectric material on the patterned mask layer from the first height to a second height, wherein the etch back process comprises subjecting the dielectric material to a blanket etching process;
    performing a second etching step to reduce a peak height of the dielectric material on the patterned mask layer; and
    performing a planarization process to remove the dielectric material on the patterned mask layer, wherein a polishing pad is used during the planarization process, the polishing pad has a disk surface, a first pressure is applied on a central portion of the disk surface, a second pressure is applied on a peripheral portion of the disk surface, and the second pressure is greater than the first pressure.

2. The method as claimed in claim 1, wherein the first etching step comprises a top corner rounding process to form a rounding corner between a sidewall of the trench and a top surface of the substrate.

3. The method as claimed in claim 1, further comprising after forming the trench and before forming the dielectric material, performing a pullback process to the patterned mask layer such that an opening of the patterned mask layer has a width larger than a width of the trench.

4. The method as claimed in claim 3, further comprising after performing the pullback process and before forming the dielectric material, forming an oxide liner layer on a sidewall and a bottom of the trench.

5. The method as claimed in claim 4, further comprising performing an annealing process to the oxide liner layer.

6. The method as claimed in claim 1, wherein the step of forming the dielectric material comprises performing a high-density plasma chemical vapor deposition process.

7. The method as claimed in claim 1, wherein the etch back step comprises a sputter etch back process.

8. The method as claimed in claim 1, wherein the difference between the second height and the first height is 0.2 µm-0.3 µm.

9. The method as claimed in claim 1, wherein the second etching step comprises a dry-etching process, and the dry-etching process has an etch selectivity ratio of the patterned mask layer to the dielectric material being 1:20-1:25.

10. The method as claimed in claim 9, wherein after the second etching step, the peak height of the dielectric material on the patterned mask layer is reduced to a third height, and the third height is 2%-3.5% of the second height.

11. The method as claimed in claim 1, wherein the peripheral portion of the disk surface has a width in a direction from an edge of the disk surface to a central point of the disk surface being 35%-50% of the radius of the disk surface.

12. The method as claimed in claim 1, wherein the difference between the second pressure and the first pressure is 30 psi-40 psi.

13. The method as claimed in claim 1, wherein the patterned mask layer comprises a pad oxide layer and a silicon nitride layer disposed on the pad oxide layer.

14. The method as claimed in claim 1, wherein the trench has an aspect ratio between 0.375 and 0.5.

15. The method as claimed in claim 4, wherein the oxide liner layer covers a rounding corner.

16. The method as claimed in claim 4, wherein the oxide liner layer extends to a top surface of the substrate.

17. The method as claimed in claim 16, wherein after performing the planarization process, a part of the dielectric material is left on the top surface of the substrate and covers the oxide liner layer.

* * * * *